(12) United States Patent
Seo et al.

(10) Patent No.: US 7,774,733 B2
(45) Date of Patent: Aug. 10, 2010

(54) METHOD AND APPARATUS FOR USER INTERFACE IN HOME NETWORK AND ELECTRONIC DEVICE AND STORAGE MEDIUM THEREFOR

(75) Inventors: Joon-kyu Seo, Seoul (KR); Sang-woong Hwang, Seongnam-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 659 days.

(21) Appl. No.: 11/600,194

(22) Filed: Nov. 16, 2006

(65) Prior Publication Data

US 2007/0261008 A1    Nov. 8, 2007

(30) Foreign Application Priority Data

Apr. 24, 2006   (KR) .................... 10-2006-0036827

(51) Int. Cl.
*G06F 17/50* (2006.01)
(52) U.S. Cl. .............. 716/11; 716/8; 716/9; 716/10; 715/848; 715/849; 715/850; 715/851; 715/852
(58) Field of Classification Search ............... 716/8–11; 715/848–852
See application file for complete search history.

(56) References Cited

U.S. PATENT DOCUMENTS

| | | | | |
|---|---|---|---|---|
| 5,581,261 A | * | 12/1996 | Hickman et al. | 342/385 |
| 5,767,855 A | * | 6/1998 | Bardon et al. | 715/848 |
| 6,483,461 B1 | * | 11/2002 | Matheney et al. | 342/463 |
| 6,563,430 B1 | * | 5/2003 | Kemink et al. | 340/825.49 |
| 6,791,529 B2 | * | 9/2004 | Shteyn | 345/156 |
| 6,957,075 B1 | * | 10/2005 | Iverson | 455/456.3 |
| 7,092,943 B2 | * | 8/2006 | Roese et al. | 707/9 |
| 7,200,639 B1 | * | 4/2007 | Yoshida | 709/208 |
| 7,480,746 B2 | * | 1/2009 | Simon et al. | 710/16 |
| 7,526,122 B2 | * | 4/2009 | Usuda et al. | 382/159 |
| 7,530,027 B2 | * | 5/2009 | MacInnis et al. | 715/768 |
| 2001/0030667 A1 | * | 10/2001 | Kelts | 345/854 |
| 2004/0125044 A1 | * | 7/2004 | Suzuki | 345/1.1 |
| 2006/0050892 A1 | * | 3/2006 | Song et al. | 381/59 |
| 2006/0052998 A1 | * | 3/2006 | Michelman | 703/22 |
| 2007/0179867 A1 | * | 8/2007 | Glazer et al. | 705/27 |
| 2007/0191070 A1 | * | 8/2007 | Rao | 455/566 |

FOREIGN PATENT DOCUMENTS

| | | |
|---|---|---|
| JP | 2003-085356 A | 3/2003 |
| KR | 10-0288508 B1 | 2/2001 |

\* cited by examiner

*Primary Examiner*—Naum B Levin
(74) *Attorney, Agent, or Firm*—Sughrue Mion, PLLC

(57) ABSTRACT

A user interface method and apparatus which allow a user to intuitively control electronic devices connected to a home network by using a virtual 3D space layout diagram, and electronic devices and storage media therefor are provided. The user interface method includes: generating a virtual 3D space layout diagram based on 3D position information regarding at least one electronic device connected to a home network; displaying the generated virtual 3D space layout diagram; receiving an input signal based on the displayed virtual 3D space layout diagram; and performing a user interface function corresponding to the received input signal.

20 Claims, 9 Drawing Sheets

METHOD AND APPARATUS FOR USER INTERFACE IN HOME NETWORK AND ELECTRONIC DEVICE AND STORAGE MEDIUM THEREFOR

CROSS-REFERENCE TO RELATED PATENT APPLICATIONS

This application claims priority from Korean Patent Application No. 10-2006-0036827, filed on Apr. 24, 2006, in the Korean Intellectual Property Office, the disclosure of which is incorporated herein by reference in its entirety.

BACKGROUND OF THE INVENTION

1. Field of the Invention

Methods and apparatuses consistent with the present invention relate to a user interface in a home network, and more particularly, to a user interface method and apparatus capable of allowing a user to intuitively control electronic devices connected to a home network, and electronic devices and storage media therefor.

2. Description of the Related Art

With the rapid development of information technology (IT), interest in home network technology has been increasing. In home network technology, a network of electronic devices is built using home phoneline networking alliance (HomePNA), Bluetooth, and power-line communication (PLC) technologies so that a user can control the electronic devices at home by using control middleware.

In particular, the control middleware detects and manages electronic devices connected to the home network and provides a user with a user interface so that the user can control the electronic devices that are connected to the home network. At present, those suggested as such control middleware technology include universal plug and play (UPnP), Jini, Havi, and LonWorks.

As the number of electronic devices connected to a home network increases, a user interface enabling the user to intuitively control the electronic devices connected to the home network in a middleware technology is needed.

According to a conventional user interface, with icons as illustrated in FIG. 1, or with a list, the presence of electronic devices connected to the home network is informed to the user and if the user selects one electronic device by referring to the list or icons, a presentation document for controlling the selected electronic device is displayed on the user interface. Then, the user controls the selected electronic device by referring to the presentation document displayed on the user interface.

However, as described above, it is difficult for the user to intuitively control the electronic devices connected to the home network and contents provided by the devices, based on the list or icons such as those illustrated in FIG. 1.

That is, although the user can identify the presence of the electronic devices connected to the home network through the icons or list displayed on the user interface, the user cannot identify the arrangement of the electronic devices in the house. Accordingly, it is difficult for the user to intuitively control the electronic devices by considering the relationships of the layout in the house. Also, it is difficult to identify contents that can be provided from respective electronic devices, based on the icons or list displayed on the user interface, and therefore it is difficult for the user to intuitively share the contents provided by the electronic devices connected to the home network.

SUMMARY OF THE INVENTION

An aspect of the present invention provides a user interface method and apparatus capable of allowing a user to intuitively control electronic devices connected to a home network by using a virtual three dimensional (3D) space layout diagram, and electronic devices and storage media therefor.

An aspect of the present invention also provides a user interface method and apparatus capable of allowing a user to intuitively share contents that can be provided by electronic devices connected to a home network by using a virtual 3D space layout diagram, and electronic devices and storage media therefor.

According to an aspect of the present invention, there is provided a user interface method including: generating a virtual 3-dimensional (3D) space layout diagram based on 3D position information on at least one electronic device connected to a home network; displaying the generated virtual 3D space layout diagram; receiving an input signal based on the displayed virtual 3D space layout diagram; and performing a user interface function corresponding to the received input signal.

According to another aspect of the present invention, there is provided a user interface apparatus including: a display unit displaying a virtual 3D space layout diagram including at least one electronic device connected to a home network; an input signal reception unit receiving an input signal based on the virtual 3D space layout diagram; and a user interface processing unit generating the virtual 3D space layout diagram based on the 3D position information of the at least one electronic device, displaying the generated virtual 3D space layout diagram on the display unit, and performing a user interface function corresponding to an input signal received through the input signal reception unit.

According to another aspect of the present invention, there is provided an electronic device including: a network interface unit communicating data with other electronic devices through a home network; a storage unit storing information required for generating at least one virtual 3D space layout diagram including at least one electronic device connected to the home network; a user interface apparatus generating and displaying the virtual 3D space layout diagram and performing a user interface function according to an input signal based on the displayed virtual 3D space layout diagram; and a control unit, whenever connection of at least one electronic device is informed through the network interface unit, providing at least one of the information received from the network interface unit and the information stored in the storage unit, to the user interface apparatus.

According to another aspect of the present invention, there is provided a computer readable recording medium having embodied thereon a computer program for executing a user interface method, wherein the method includes generating a virtual 3-dimensional (3D) space layout diagram based on 3D position information on at least one electronic device connected to a home network; displaying the generated virtual 3D space layout diagram; receiving an input signal based on the displayed virtual 3D space layout diagram; and performing a user interface function corresponding to the received input signal.

The virtual 3D space layout diagram may include information on at least one of the electronic devices.

BRIEF DESCRIPTION OF THE DRAWINGS

The aspects of the present invention will become more apparent by describing in detail exemplary embodiments thereof with reference to the attached drawings in which.

DETAILED DESCRIPTION OF EXEMPLARY EMBODIMENTS OF THE INVENTION

Aspects of the present invention will now be described more fully with reference to the accompanying drawings, in which exemplary embodiments of the invention are shown.

Figure 1:
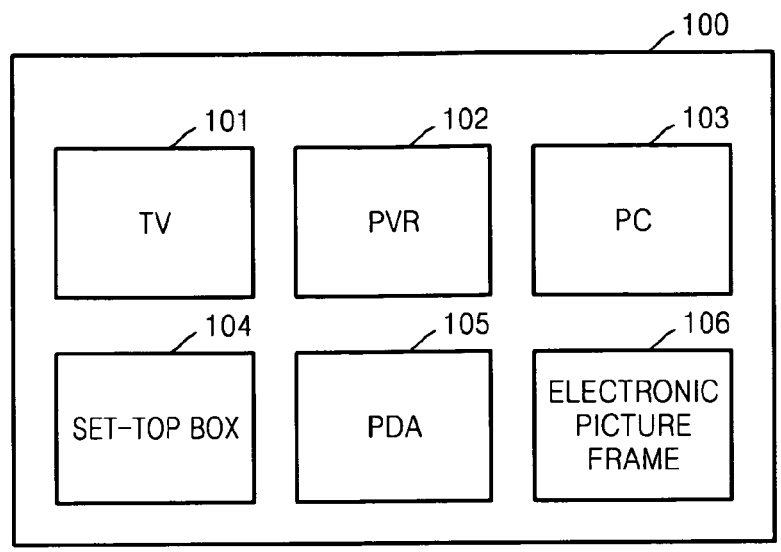
FIG. 1 illustrates an example of a conventional user interface screen in a home network.
Figure 2:
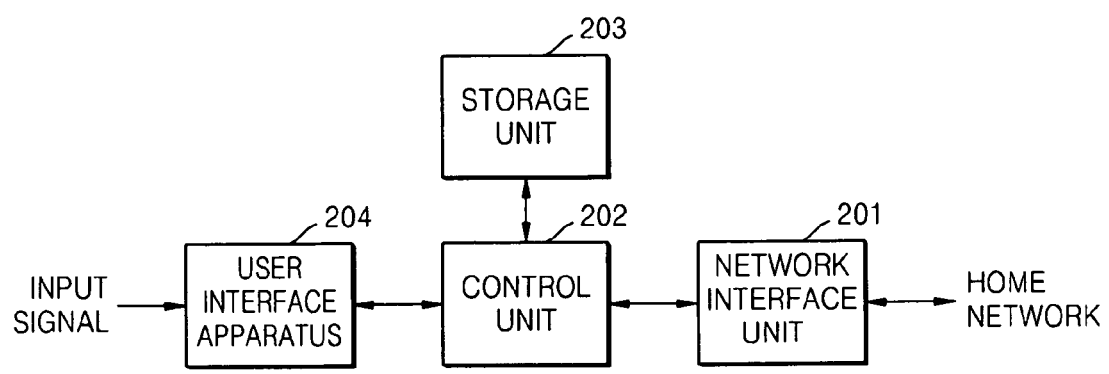
FIG. 2 is a function block diagram of an electronic device including a user interface apparatus according to an exemplary embodiment of the present invention.

FIG. 2 is a function block diagram of an electronic device including a user interface apparatus according to an exemplary embodiment of the present invention. The electronic device is a network device connected to a home network and is capable of operating as a control point. An example of such an electronic device is a digital television (DTV). Referring to FIG. 2, the electronic device includes a network interface unit 201, a control unit 202, a storage unit 203, and a user interface apparatus 204.

The network interface unit 201 transmits data to and receives data from other electronic devices through the home network. The other electronic devices may include electronic devices (or network devices) operating as control points in the home network and electronic devices (or network devices) controlled by the control points.

In particular, whenever at least one electronic device is connected to the home network, the network interface unit 201 informs this fact to the control unit 202.

If 3D position information, or 3D position information and 3D information, are received from a connected electronic device, the network interface unit 201 transmits this information to the control unit 202. 3D position information is information regarding the position of the electronic device in a virtual 3D space, and 3D information is rendering-based information and may include, but is not limited to, vertex information, texture information, and surface information.

Whenever the connection of at least one electronic device is informed by the network interface unit 201, the control unit 202 provides the user interface apparatus 204 with at least one of the information received from the network interface unit 201 and information stored in the storage unit 203.

The information received from the network interface unit 201 includes the 3D position information or the 3D position information and 3D information of the electronic device. The information stored in the storage unit 203 includes information required to generate a virtual 3D space layout diagram of the electronic devices connected to the home network. The required information includes 3D information that can substitute for the 3D position information of the electronic device connected to the home network when the 3D position information is not received, and information that can substitute for the 3D information when the 3D information is not received. Such information may include the names of all devices that can be connected to the home network or general 3D information. The general 3D information is 3D information of devices, for example, a notebook computer, a digital camera, and a personal multimedia player (PMP), and may be 3D information not considering a design with respect to a product, such as a symbol of a device, or 3D rendering-based information.

Also, the control unit 202 can transmit a signal to control at least one electronic device connected to the home network, to the network interface unit 201, according to a signal output from the user interface apparatus 204. Accordingly, the at least one electronic device connected to the home network can perform an operation. For example, according to a control signal output from the control unit 202, a DVD player (not shown) connected to the home network can perform an operation for reproducing video contents.

The user interface apparatus 204 generates and displays a virtual 3D space layout diagram, performs a user interface function with respect to an input signal based on the displayed virtual 3D space layout diagram, and provides the result of the performed user interface function to the control unit 202. The user interface apparatus 204 will now be explained in more detail with reference to a variety of exemplary embodiments.

Figure 3:
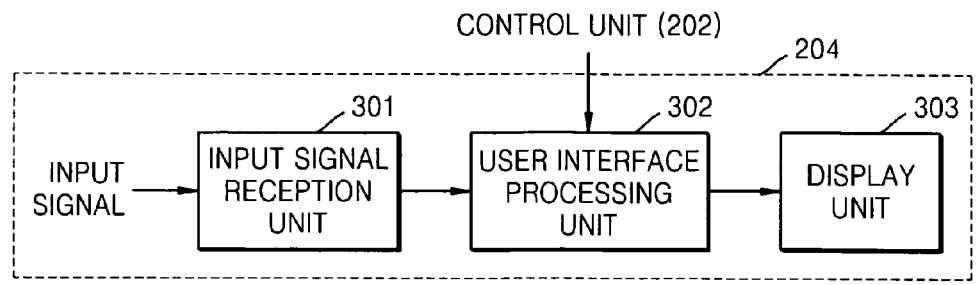
FIG. 3 is a function block diagram of a user interface apparatus according to an exemplary embodiment of the present invention.

The user interface apparatus 204 may be configured as illustrated in FIG. 3. FIG. 3 is a function block diagram of the user interface apparatus 204 according to an exemplary embodiment of the present invention. Referring to FIG. 3, the user interface apparatus 204 includes an input signal reception unit 301, a user interface processing unit 302, and a display unit 303.

Figure 4:
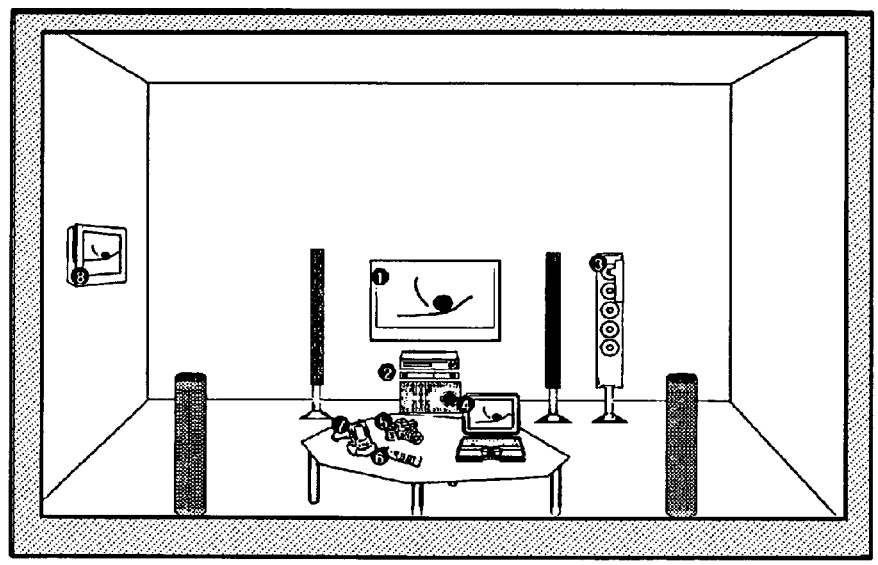
FIG. 4 illustrates an example of a user interface screen according to an exemplary embodiment of the present invention.

The input signal reception unit 301 can receive an input signal based on the virtual 3D space layout diagram displayed on the display unit 303. For example, when an electronic device to which the user interface apparatus 204 is applied is a DTV, a virtual 3D space layout diagram displayed is as illustrated in FIG. 4, and an input signal is provided using a remote controller. The input signal reception unit 301 is built so as to receive numeric information transmitted from the remote controller. The numeric information is identification (ID) information assigned to each electronic device as can be known from FIG. 4. The ID information can be determined in the order in which electronic devices are registered in the home network. That is, an electronic device with ID information having a small number may be an electronic device that was registered in the home network much earlier.

FIG. 4 illustrates an example of a user interface screen according to an exemplary embodiment of the present invention, and shows a virtual 3D space layout diagram, including 3D position information and 3D information of electronic devices connected to a home network. Also, a virtual 3D space layout considering only 3D position information of electronic devices can be generated as a user interface screen. If a virtual 3D space layout diagram is generated as a user interface screen by considering only 3D position information of electronic devices, the virtual 3D space layout diagram displayed on the display unit 303 may have an appearance of the 3D space layout diagram of FIG. 4, excluding the 3D information of each electronic device. For example, instead of the 3D information of each electronic device, a virtual 3D space layout diagram in which the name of each electronic device is expressed can be displayed.

Based on 3D position information or 3D position information and 3D information of at least one electronic device connected to the home network, the user interface processing unit 302 generates a virtual 3D space layout diagram and displays the generated virtual 3D space layout diagram on the display unit 303.

Whenever an electronic device is connected to the home network, the user interface processing unit 302 can update the virtual 3D space layout diagram based on the input 3D position information or 3D position information and 3D information. The 3D position information and 3D information can be provided from the control unit 202 of FIG. 2.

The user interface processing unit 302 can generate a virtual 3D space layout diagram with respect to each 3D space present in a house. A virtual 3D space layout diagram with respect to each 3D space present in a house can be generated based on preset classification information on 3D spaces present in a house and electronic devices disposed in each 3D space, and information on electronic devices currently connected to the home network. The classification information can be managed in the user interface processing unit 302 or can be provided by the control unit 202. In order to provide the classification information, the control unit 202 can manage the classification information or the storage unit 203 can store the classification information.

When a virtual 3D space layout diagram with respect to each 3D space present in the house is generated, the user interface processing unit 302 displays on the display unit 303 one of the generated virtual 3D space layout diagrams. The display unit 303 displays the virtual 3D space layout diagram, including at least one electronic device connected to the home network, as illustrated in FIG. 4.

If an input signal is received through the input signal reception unit 301, the user interface processing unit 302 performs a user interface function corresponding to the input signal.

For example, while a virtual 3D space layout diagram is displayed on the display unit 303 as illustrated in FIG. 4, if numeric information "1" from the input signal reception unit 301 is received, the user interface processing unit 302 highlights an electronic device assigned "1" in the virtual 3D space layout diagram displayed on the display unit 203, or displays a list or an icon of contents, including content type information, which can be provided by the electronic device. In order to display the list or the icon of the contents, the user interface processing unit 302 can receive the list or the icon of contents that can be provided by each electronic device, from the control unit 202. The icon may include a 3D shape of a corresponding electronic device.

If the list of the contents is displayed on the display unit 303 and a signal selecting any one item in the displayed list of the contents is input from the input signal reception unit 301, the user interface processing unit 302 can output information on the selected content item as a result of performing a user interface function. The result of the performing the user interface function is transmitted to the control unit 202 shown in FIG. 2.

Also, if an input signal requesting to change the 3D position of at least one electronic device among the electronic devices included in the currently displayed virtual 3D space layout diagram is received through the input signal reception unit 301, the user interface processing unit 302 can display a virtual 3D space layout diagram in which the 3D position of the electronic device is changed in the virtual 3D space layout diagram displayed on the display unit 303.

Figure 5:
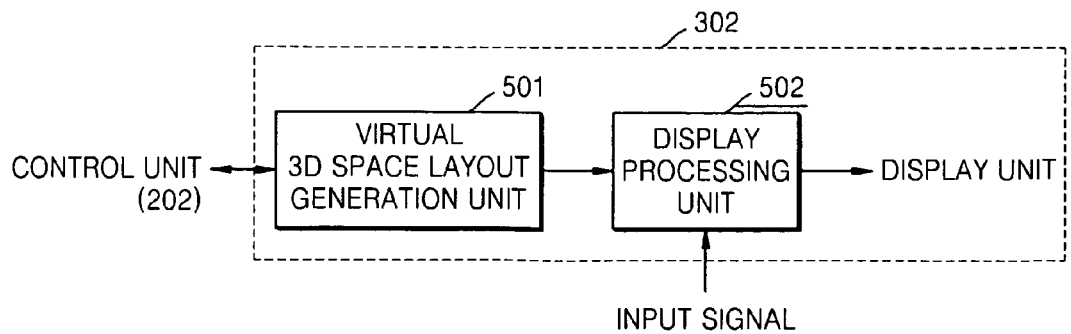
FIG. 5 is a function block diagram of a user interface processing unit of FIG. 3 according to an exemplary embodiment of the present invention.

The user interface processing unit 302 illustrated in FIG. 3 can be configured as illustrated in FIG. 5. FIG. 5 is a function block diagram of the user interface processing unit 302 of FIG. 3 according to an exemplary embodiment of the present invention. Referring to FIG. 5, the user interface processing unit 302 includes a virtual 3D space layout generation unit 501 and a display processing unit 502.

The virtual 3D space layout diagram generation unit 501 generates a virtual 3D space layout diagram based on 3D position information or 3D position information and 3D information of each electronic device connected to the home network transmitted from the control unit 202. At this time, the virtual 3D space layout diagram generation unit 501 can generate a virtual 3D space layout diagram with respect to each 3D space in the house. For this, the virtual 3D space layout diagram generation unit 501 can refer to the classification information described with reference to FIG. 3. The classification information can be provided from the control unit 202.

The display processing unit 502 displays a virtual 3D space layout diagram, which is generated in the virtual 3D space layout diagram generation unit 501, according to an input signal transmitted from the input signal reception unit 301.

That is, when a virtual 3D space layout diagram with respect to each 3D space in the house is generated, the display processing unit 502 can display one selected virtual 3D space layout diagram on the display unit 303 according to the input signal. For this, the display processing unit 502 can include a storage element (not shown) for storing a virtual 3D space layout diagram of each 3D space in the house and a selection element (not shown) for selecting and displaying one of the virtual 3D space layout diagrams of respective 3D spaces that are stored in the storage element, according to an input signal.

Also, the display processing unit 502 can change a 3D space layout diagram currently displayed on the display unit 303 into another virtual 3D space layout diagram according to an input signal. For this, the display processing unit 502 can include the storage element (not shown) and the selection element (not shown).

According to an input signal, the display processing unit 502 can change the 3D position of an electronic device that is included in a displayed 3D space layout diagram.

For this, the display processing unit 502 can include the storage element (not shown) and an update element (not shown) for updating a virtual 3D space layout diagram.

According to an input signal, the display processing unit 502 can highlight an electronic device that is selected in a displayed virtual 3D space layout diagram or can display a list or an icon of contents that can be provided by the selected electronic device. For this, the display processing unit 502 can include the storage element (not shown), a storage element (not shown) for storing the list or the icon of the contents, and the update element (not shown).

In order to display the list or the icon of the contents that can be provided by the selected electronic device, the display processing unit 502 can request the list or the icon of the contents of the electronic device from the control unit 202 of FIG. 2. The control unit 202 can receive the list or the icon of the contents of the electronic device connected to the home network through the network interface unit 201, or can generate the icon of the contents based on the received list of the contents of the electronic device, and can provide the list or icon to the display processing unit 502.

Figure 6:
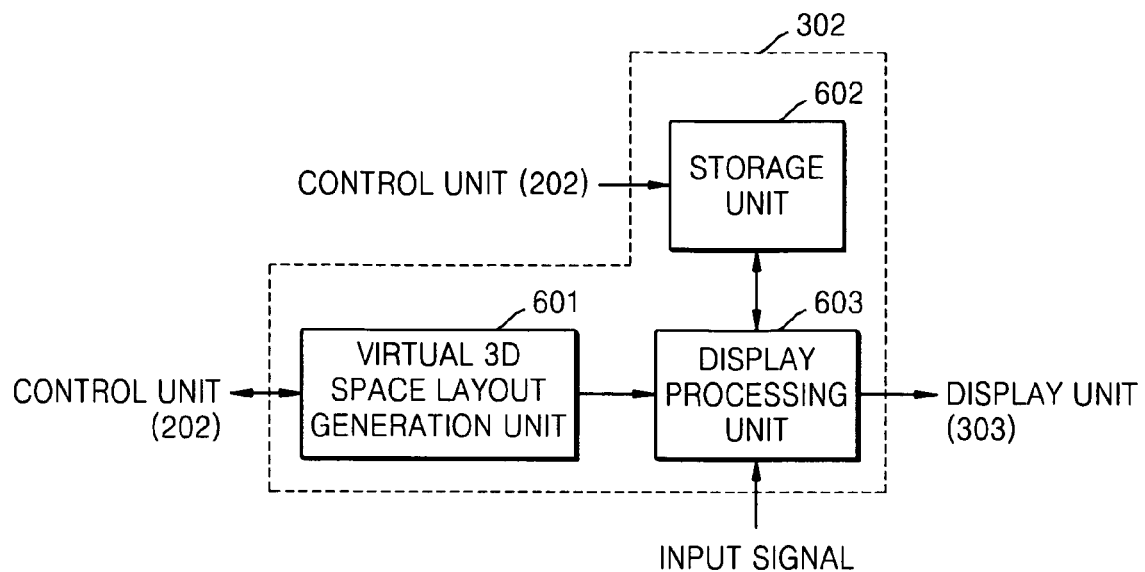
FIG. 6 is another function block diagram of a user interface processing unit of FIG. 3 according to another exemplary embodiment of the present invention.

Meanwhile, the user interface processing unit 302 may be configured as illustrated in FIG. 6. FIG. 6 is a function block diagram of the user interface processing unit 302 of FIG. 3 according to another exemplary embodiment of the present invention. Referring to FIG. 6, the user interface processing unit 302 includes a virtual 3D space layout diagram generation unit 601, a storage unit 602 and a display processing unit 603.

The virtual 3D space layout diagram generation unit 601 generates a virtual 3D space layout diagram, like the virtual 3D space layout diagram generation unit 501 of FIG. 5. The virtual 3D space layout diagram generation unit 601 can generate a virtual 3D space layout diagram including information on the types of contents that are provided by at least one electronic device connected to the home network.

Figure 7:
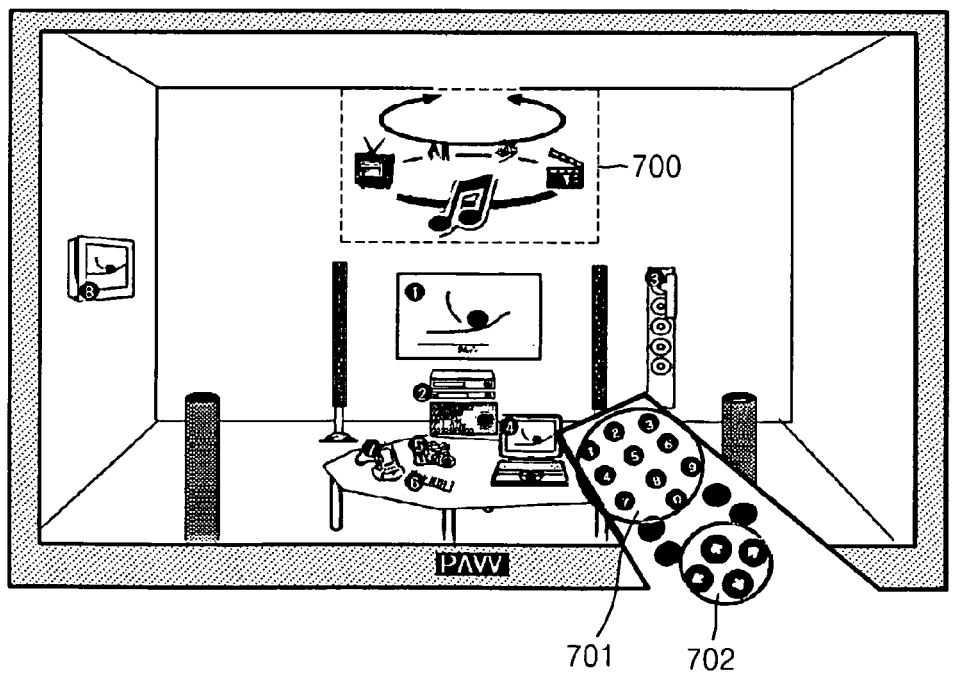
FIG. 7 illustrates another example of a user interface screen according to an exemplary embodiment of the present invention.

That is, the virtual 3D space layout generation unit 601 can generate a virtual 3D space layout diagram including content type information 700 in a virtual 3D space layout diagram as illustrated in FIG. 7. The content type information can be provided from the control unit 202. The virtual 3D space layout generation unit 601 can generate a virtual 3D space layout diagram such that the content type information 700 is displayed in the air of the virtual 3D space as illustrated in FIG. 7.

The storage unit 602 stores link information between content type information and an electronic device included in a virtual 3D space layout diagram. The link information can be provided from the control unit 202. For example, if electronic devices providing audio content type information in the content type information 700 are the electronic devices assigned numeric information "3" and "4", "3" and "4" can be defined as registered information on electronic devices capable of providing audio content type information.

The display processing unit 603 displays on the display unit 303 a virtual 3D space layout diagram generated in the virtual 3D space layout diagram generation unit 601 based on an input signal transmitted from the input signal reception unit 301 and the link information stored in the storage unit 602.

For example, if an input signal transmitted from the input signal reception unit 301 is a signal selecting an item of content type information 700, the display processing unit 603 can display with highlights at least one electronic device providing the content type information selected among electronic devices included in a 3D space layout diagram that is displayed on the display unit 30. Also, if an input signal selecting one of at least one or more electronic devices displayed with highlights is received, the display processing unit 603 can display a virtual 3D space layout diagram in which the selected content type information is moved to the 3D position of the selected electronic device. In addition, if an input signal selecting one of at least one or more electronic devices displayed with highlights is received, the display processing unit 603 can display one of a list and an icon of the contents included in the selected content type information among the contents that can be provided by the selected electronic device.

As illustrated in FIG. 7, the input signal reception unit 301 is built so that when a signal to select an electronic device in a virtual 3D space layout diagram is input using the number buttons 701 of a remote controller, or when a signal to select an electronic device in the virtual 3D space layout diagram and a signal to select content type information in the virtual 3D space layout diagram are input using the direction buttons 702 of the remote controller, such signals can be received.

The exemplary embodiments described above can be modified so that the user interface processing unit 302 can be included in the control unit 202 of FIG. 2.

Figure 8:
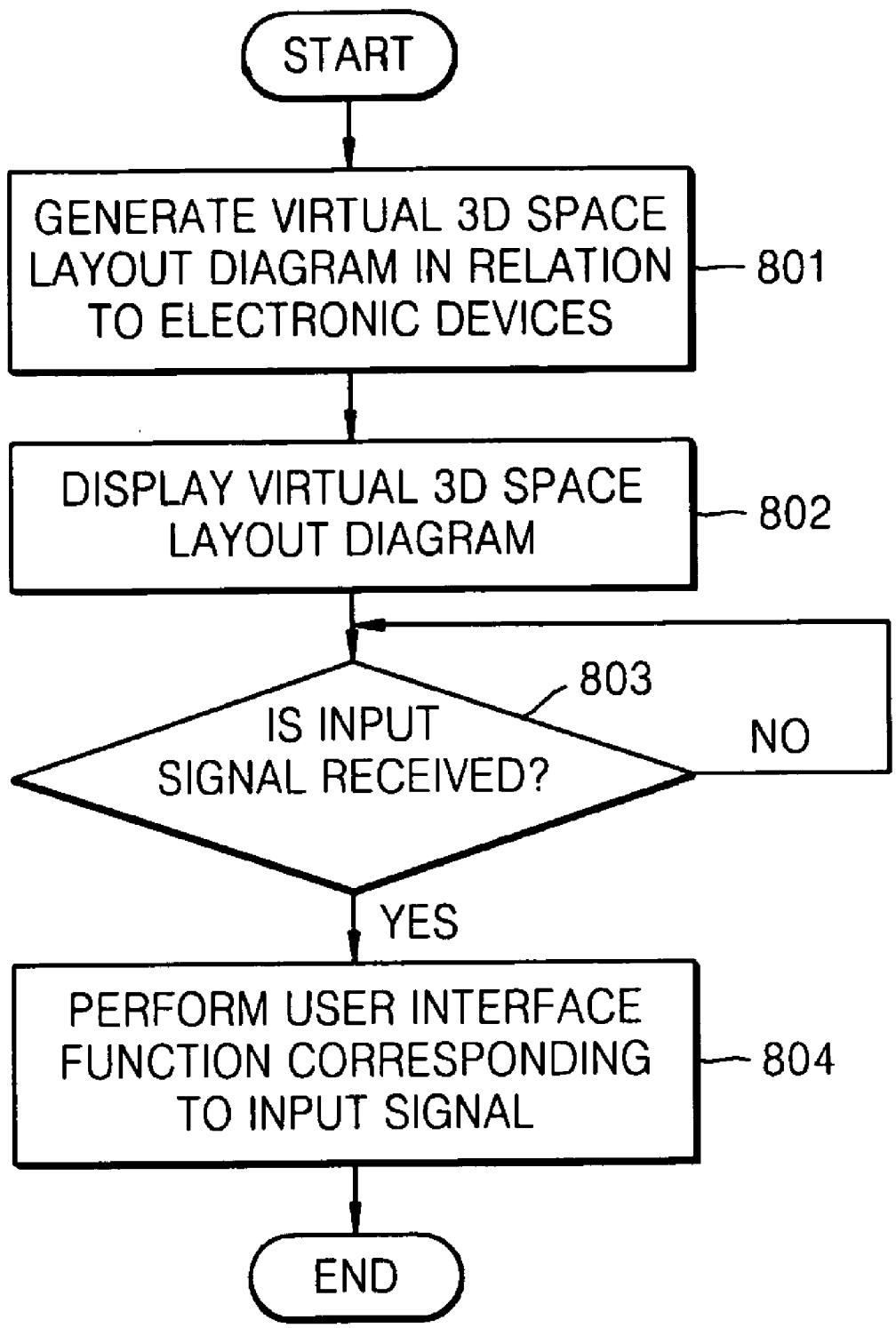
FIG. 8 is a flowchart of operations of a user interface method according to an exemplary embodiment of the present invention.

FIG. 8 is a flowchart of operations of a user interface method according to an exemplary embodiment of the present invention. Referring to FIG. 3, the operations of the method of FIG. 8 will now be explained in greater detail.

First, in operation 801, the user interface processing unit 302 generates a virtual 3D space layout diagram based on the 3D position information or the 3D position information and 3D information of at least one electronic device connected to the home network. The 3D information is rendering-based information of each electronic device. The virtual 3D space layout diagram can be generated with respect to each 3D space present in the house. Also, the generated virtual 3D space layout diagram can include content type information as illustrated in FIG. 7.

Furthermore, as illustrated in FIGS. 4 and 7, respectively, a virtual 3D space layout diagram can be generated in which ID information, such as numeric information, is assigned to each electronic device.

In operation 802, the user interface processing unit 302 displays the generated virtual 3D space layout diagram on the display unit 303. If a virtual 3D space layout diagram is generated with respect to each 3D space present in the house, the user interface processing unit 302 displays one virtual 3D space layout diagram.

If an input signal based on the virtual 3D space layout diagram that is displayed on the display unit 303 is received in operation 803, then in operation 804, the user interface processing unit 302 performs a user interface function corresponding to the received input signal.

Figure 9:
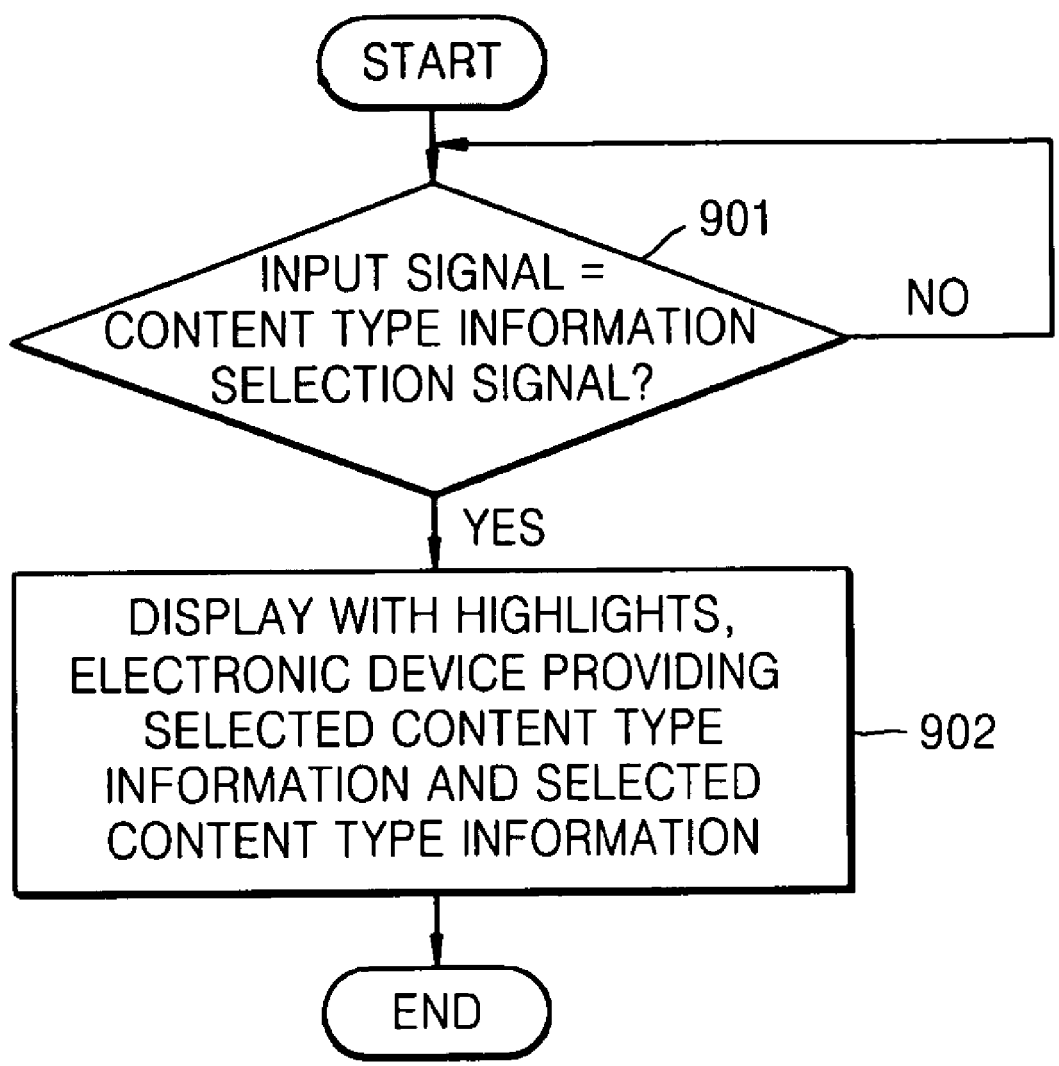
FIG. 9 is a detailed flowchart of an operation for performing a user interface function shown in FIG. 8 according to an exemplary embodiment of the present invention.

The user interface function to be performed in operation 804 may be performed as illustrated in FIG. 9, for example. FIG. 9 is a detailed flowchart of operation 804 for performing a user interface function shown in FIG. 8 according to an exemplary embodiment of the present invention.

Referring to FIG. 9, in operation 901, if the received input signal is a content type information selection signal, then in operation 902 the user interface processing unit 302 displays with highlights at least one electronic device providing the selected content type information among the electronic devices included in the displayed 3D space layout diagram and selected content type information.

Figure 10:
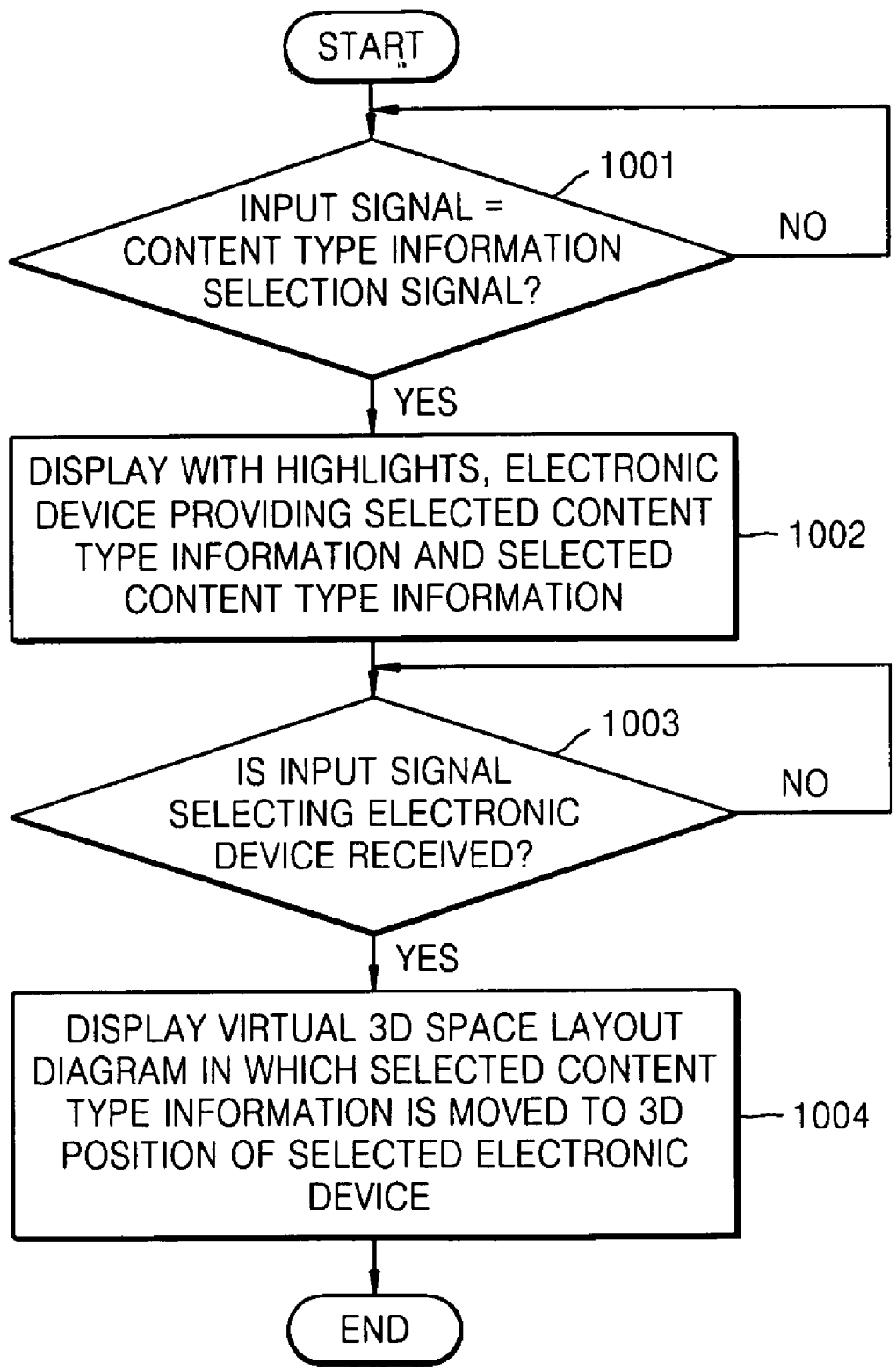
FIG. 10 is another detailed flowchart of an operation for performing a user interface function shown in FIG. 8 according to another exemplary embodiment of the present invention.

The user interface function to be performed in operation 804 may also be performed as illustrated in FIG. 10. FIG. 10 is a detailed flowchart of operation 804 for performing a user interface function shown in FIG. 8 according to another exemplary embodiment of the present invention.

Referring to FIG. 10, in operation 1001, if the received input signal is a content type information selection signal, then in operation 1002 the user interface processing unit 302 displays with highlights electronic devices providing the selected content type information and the selected content type information.

Then, in operation 1003, if an input signal selecting one of at least one or more highlighted electronic devices is received, then in operation 1004, the user interface processing unit 302 displays a virtual 3D space layout diagram in which the selected content type information is moved to the 3D position of the selected electronic device.

Figure 11:
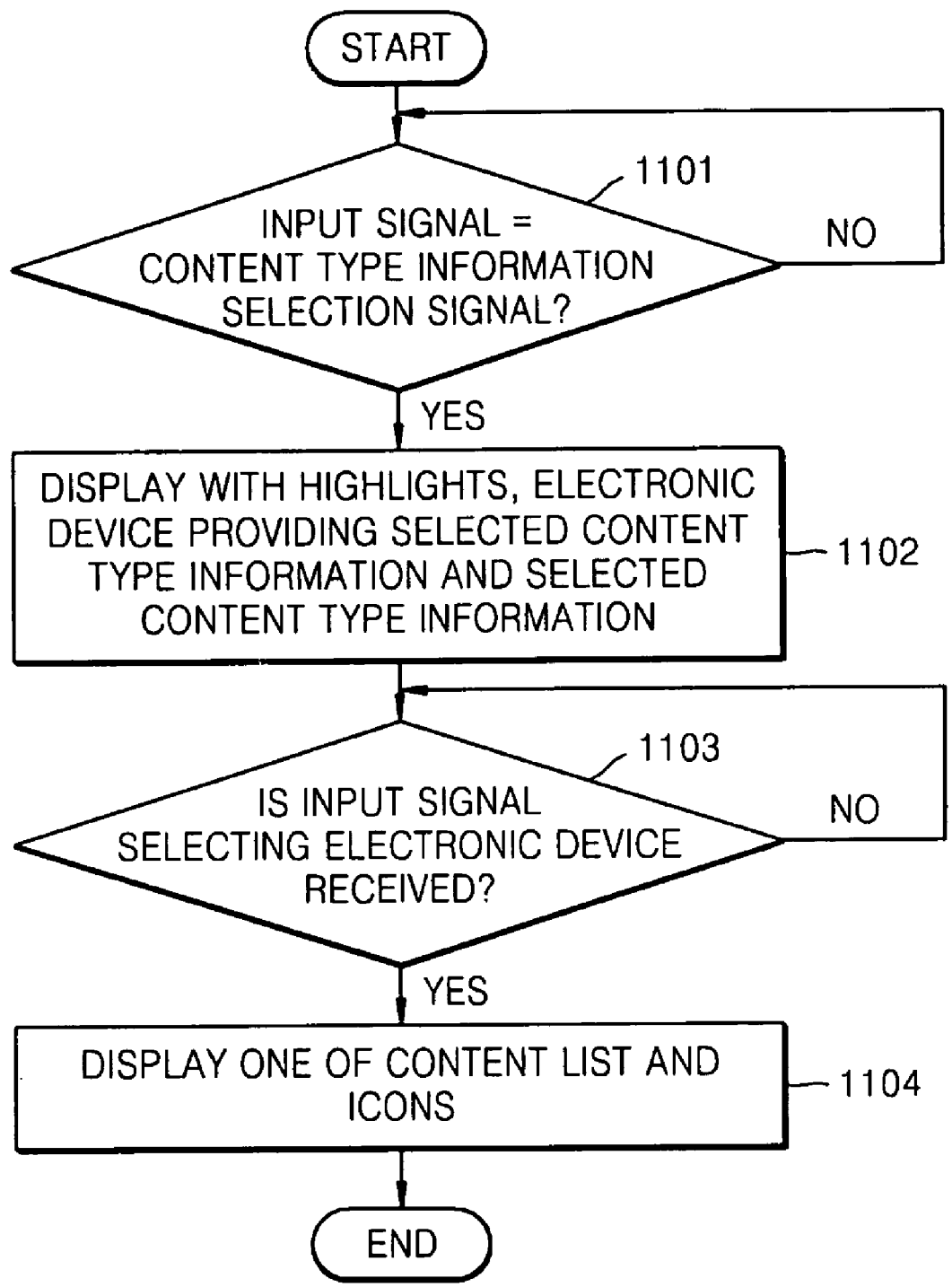
FIG. 11 is another detailed flowchart of an operation for performing a user interface function shown in FIG. 8 according to another exemplary embodiment of the present invention.

The user interface function to be performed in operation 804 may also be performed as illustrated in FIG. 11. FIG. 11 is a detailed flowchart of operation 804 for performing a user interface function shown in FIG. 8 according to another exemplary embodiment of the present invention.

Referring to FIG. 11, in operation 1101, if the received input signal is a content type information selection signal, then in operation 1102 the user interface processing unit 302 displays with highlights electronic devices providing the selected content type information and the selected content type information.

Then, if an input signal selecting one of at least one or more highlighted electronic devices is received in operation 1103, then in operation 1104 the user interface processing unit 302 displays one of a list and an icon of contents included in the selected type information among contents that can be provided by the selected electronic device.

Figure 12:
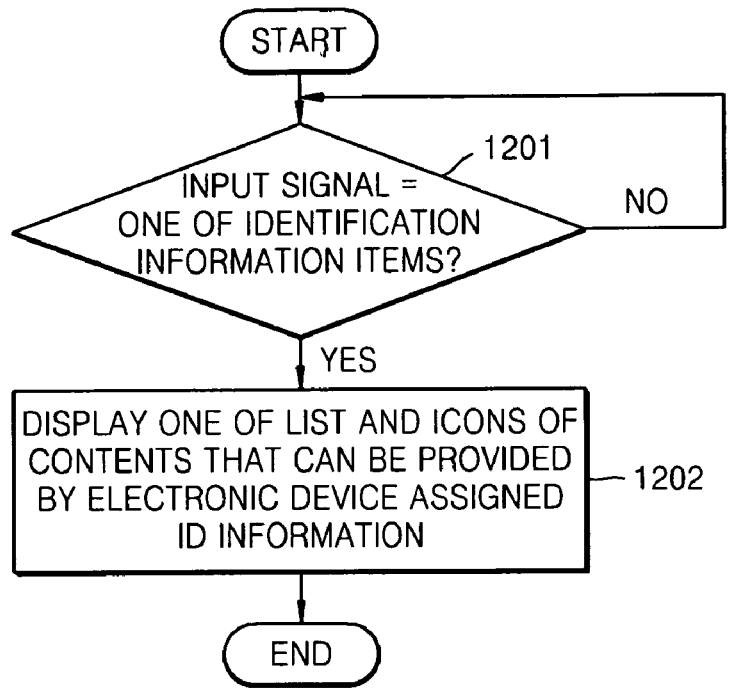
FIG. 12 is another detailed flowchart of an operation for performing a user interface function shown in FIG. 8 according to another exemplary embodiment of the present invention.

The user interface function to be performed in operation 804 may also be performed as illustrated in FIG. 12. FIG. 12 is a detailed flowchart of operation 804 for performing a user interface function shown in FIG. 8 according to another exemplary embodiment of the present invention.

Referring to FIG. 12, in operation 1201, if the received input signal is one of ID information items, the user interface processing unit 302 displays one of a list and an icon of contents that can be provided by the electronic device that has been assigned the ID information.

Figure 13:
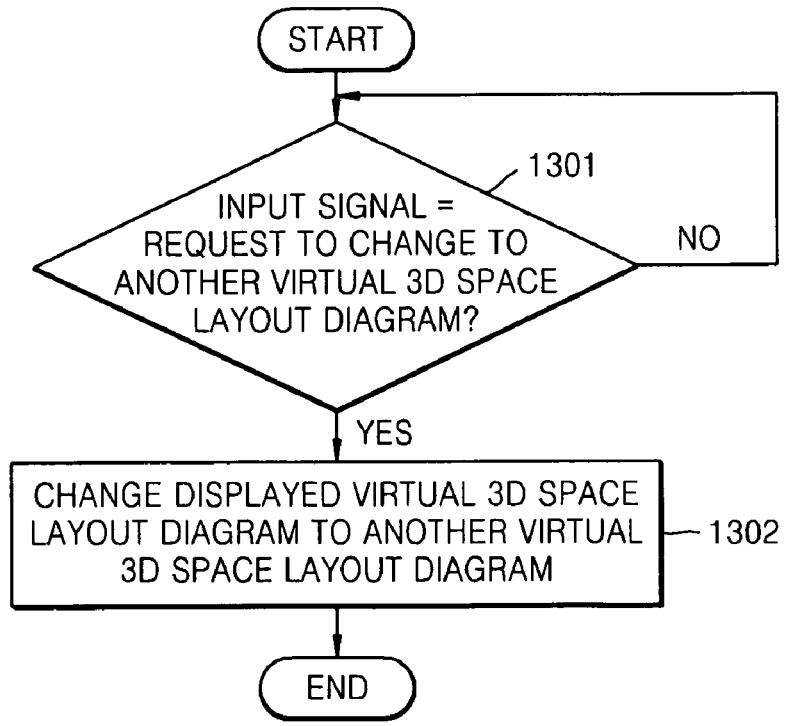
FIG. 13 is another detailed flowchart of an operation for performing a user interface function shown in FIG. 8 according to another exemplary embodiment of the present invention.

The user interface function to be performed in operation 804 may also be performed as illustrated in FIG. 13. FIG. 13 is a detailed flowchart of operation 804 for performing a user interface function shown in FIG. 8 according to another exemplary embodiment of the present invention.

Referring to FIG. 13, in operation 1301, if the received input signal is a signal requesting to change a displayed virtual 3D space layout diagram into another virtual 3D space layout diagram of the house, then in operation 1302, the user interface processing unit 302 changes the displayed virtual 3D space layout diagram into another virtual 3D space layout diagram.

Figure 14:
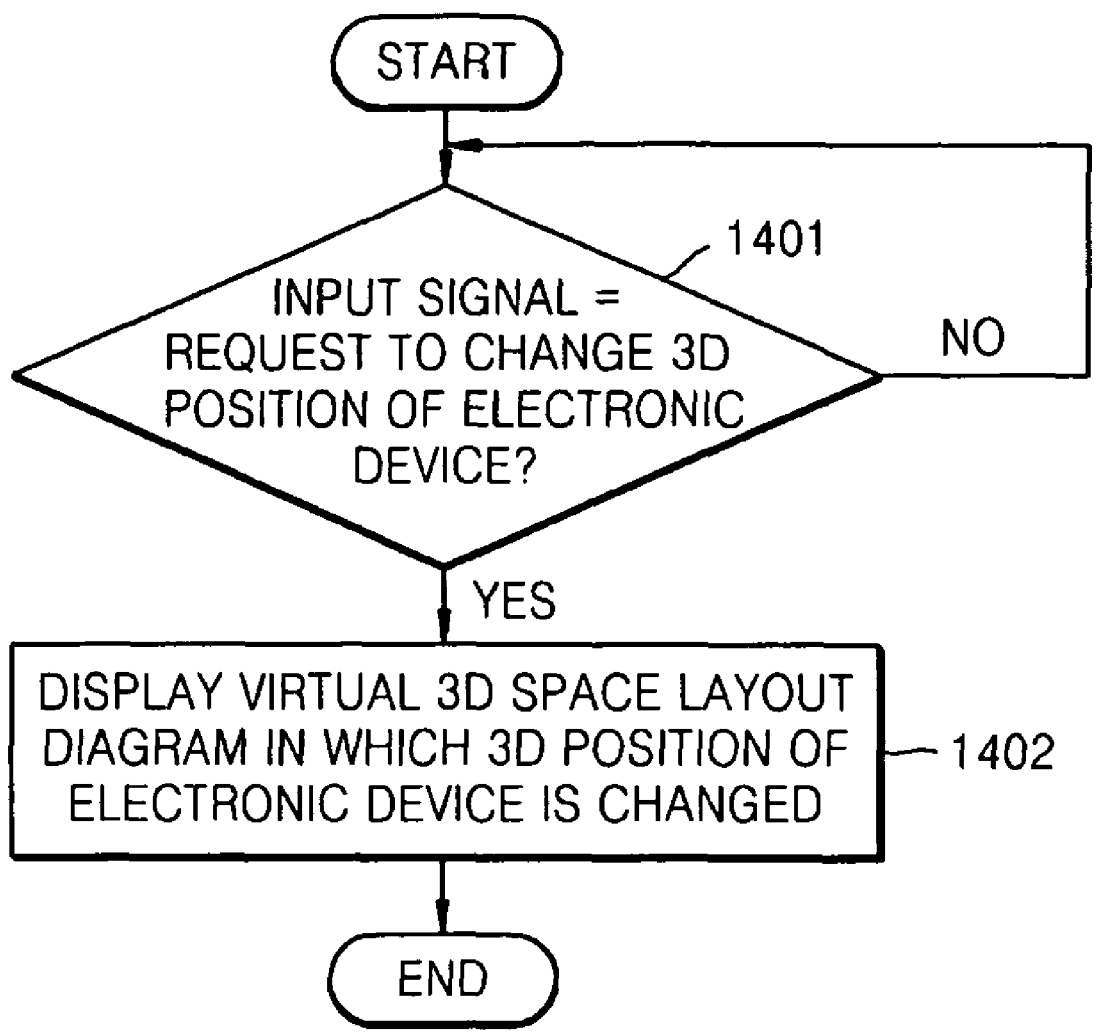
FIG. 14 is another detailed flowchart of an operation for performing a user interface function shown in FIG. 8 according to another exemplary embodiment of the present invention.

The user interface function to be performed in operation 804 may also be performed as illustrated in FIG. 14. FIG. 14 is a detailed flowchart of operation 804 for performing a user interface function shown in FIG. 8 according to another exemplary embodiment of the present invention.

Referring to FIG. 14, in operation 1401, if the received input signal is a signal requesting to change the 3D position of at least one electronic device among the electronic devices included in the virtual 3D space layout diagram, then in operation 1402 the user interface processing unit 302 displays a virtual 3D space layout diagram in which the 3D position of the electronic device is changed.

If one content that can be provided by one electronic device is selected according to the result of performing the user interface function in operation 804, the information on the selected content can be output as the result of performing the user interface function and based on the result, the function of the electronic device connected to the home network can be controlled.

Aspects of the present invention can also be embodied as computer readable codes on a computer readable recording medium. A computer readable recording medium is any data storage device that can store data which can be thereafter read by a computer system. Examples of the computer readable recording medium include, but are not limited to, read-only memory (ROM), random-access memory (RAM), CD-ROMs, magnetic tapes, floppy disks, and optical data storage devices. The computer readable recording medium can also be distributed over network coupled computer systems so that the computer readable code is stored and executed in a distributed fashion.

According to an aspect of the present invention, a user interface is provided with which electronic devices connected to a home network can be controlled based on a virtual 3D space layout diagram of the electronic devices such that the user can intuitively control electronic devices connected to the home network.

Also, by providing a user interface with which electronic devices connected to a home network can be controlled based on a virtual 3D space layout diagram including content type information, the user can intuitively share contents provided by the electronic devices connected to the home network While the present invention has been particularly shown and described with reference to exemplary embodiments thereof, it will be understood by those of ordinary skill in the art that various changes in form and details may be made therein without departing from the spirit and scope of the present invention as defined by the following claims. The exemplary embodiments should be considered in descriptive sense only and not for purposes of limitation. Therefore, the scope of the invention is defined not by the detailed description of the exemplary embodiments of the invention but by the appended claims, and all differences within the scope will be construed as being included in the present invention.

What is claimed is:

1. A user interface method comprising:
generating, by a user interface apparatus, a virtual 3-dimensional (3D) space layout diagram, including at least one electronic device connected to a home network, with respect to a 3D space present in a predetermined location using 3D position information regarding the at least one electronic device;
displaying, on a display unit, the generated virtual 3D space layout diagram;
receiving an input signal relating to the displayed virtual 3D space layout diagram; and
performing a user interface function corresponding to the received input signal,
wherein if the input signal includes information regarding a type of contents provided by the at least one electronic device, content type information of the at least one electronic device is further displayed in the generated virtual 3D space layout diagram.

2. The method of claim 1, wherein the virtual 3D space layout diagram comprises information regarding at least one electronic device.

3. The method of claim 2, wherein the information comprises 3D rendering-based information of the at least one electronic device.

4. The method of claim 1, wherein if the received input signal comprises a request to change a 3D position of the at least one electronic device, a virtual 3D space layout diagram is displayed in which the 3D position of the at least one electronic device has been changed.

5. The method of claim 1, wherein the virtual 3D space layout diagram is formed using one or more 3D space layout diagrams that exist in a house.

6. The method of claim 5, wherein if the received input signal comprises a request to change a displayed virtual 3D space layout diagram of the house into another virtual 3D space layout diagram of the house, then the displayed virtual 3D space layout diagram is changed into the other virtual 3D space layout diagram.

7. The method of claim 1, wherein if the received input signal comprises a selection of content type information, then at least one electronic device providing the selected content type information among electronic devices included in the displayed 3D space layout diagram is displayed with highlights.

8. The method of claim 7, wherein if the received input signal comprises a selection of one of the included electronic devices, then one of a list and an icon of contents included in the selected content type information is displayed.

9. The method of claim 1, wherein the virtual 3D space layout diagram further comprises identification (ID) information which is assigned to the electronic device.

10. The method of claim 9, wherein if the received input signal comprises ID information, then one of a list and an icon of contents that can be provided by an electronic device corresponding to the ID information is displayed.

11. A user interface apparatus comprising:
a display unit which displays a virtual 3D space layout diagram comprising at least one electronic device connected to a home network;
an input signal reception unit which receives an input signal relating to the virtual 3D space layout diagram; and
a user interface processing unit which generates the virtual 3D space layout diagram with respect to a 3D space present in a predetermined location using 3D position information of the at least one electronic device and which performs a user interface function corresponding to an input signal received by the input signal reception unit;
wherein the display unit displays the generated virtual 3D space layout diagram, and if the input signal includes information regarding a type of contents provided by the at least one electronic device, the display unit further displays content type information of the at least one electronic device in the generated virtual 3D space layout diagram.

12. The apparatus of claim 11, wherein if a request to change a 3D position of the at least one electronic device is received, the user interface processing unit displays a virtual 3D space layout diagram in which the 3D position of the at least one electronic device has been changed.

13. The apparatus of claim 11, wherein the virtual 3D space layout diagram comprises information regarding the at least one electronic device,
wherein the information comprises 3D rendering-based information of the at least one electronic device, and
wherein whenever an electronic device is connected to the home network, the user interface unit updates the virtual 3D space layout diagram using 3D position information and 3D rendering-based information regarding the connected electronic device.

14. The apparatus of claim 11, wherein the virtual 3D space layout diagram is formed using one or more 3D space layout diagrams that exist in a house.

15. The apparatus of claim 14, wherein the user interface processing unit manages link information between the content type information and the at least one electronic device.

16. The apparatus of claim 15, wherein the user interface processing unit comprises:
a generation unit which generates the virtual 3D space layout diagram;
a storage unit which stores the link information; and
a display processing unit which displays the virtual 3D space layout diagram on the display unit according to an input signal received by the input signal reception unit and the link information that is stored in the storage unit.

17. The apparatus of claim 11, wherein the virtual 3D space layout diagram further comprises identification (ID) information which is assigned to the electronic device.

18. The apparatus of claim 11, wherein the user interface processing unit comprises:
a generation unit which generates the virtual 3D space layout diagram; and
a display processing unit which displays the virtual 3D space layout diagram on the display unit according to an input signal received by the input signal reception unit.

19. An electronic device comprising:
a network interface unit which communicates data with electronic devices through a home network;
a storage unit which stores information required for generating at least one virtual 3D space layout diagram comprising at least one electronic device connected to the home network;
a user interface apparatus which generates the virtual 3D space layout diagram with respect to a 3D space present in a predetermined location using 3D position information regarding the at least one electronic device, and displays the virtual 3D space layout diagram and which performs a user interface function according to an input signal relating to the displayed virtual 3D space layout diagram; and
a control unit which, whenever connection of at least one electronic device is detected through the network interface unit, provides to the user interface apparatus at least one of information received from the network interface unit and information that is stored in the storage unit,
wherein if the input signal includes information regarding a type of contents provided by the at least one electronic device, the user interface apparatus further displays content type information of the at least one electronic device in the generated virtual 3D space layout diagram.

20. A tangible computer readable recording medium having recorded thereon a computer executable program for performing a user interface method, the method comprising:
generating a virtual 3-dimensional (3D) space layout diagram, including at least one electronic device connected to a home network, with respect to a 3D space present in a predetermined location using 3D position information regarding the at least one electronic device;

displaying the generated virtual 3D space layout diagram;
receiving an input signal relating to the displayed virtual 3D space layout diagram; and
performing a user interface function corresponding to the received input signal,
wherein if the input signal includes information regarding a type of contents provided by the at least one electronic device, content type information of the at least one electronic device is further displayed in the generated virtual 3D space layout diagram.

* * * * *